(12) United States Patent
Shin et al.

(10) Patent No.: US 7,812,265 B2
(45) Date of Patent: Oct. 12, 2010

(54) SEMICONDUCTOR PACKAGE, PRINTED CIRCUIT BOARD, AND ELECTRONIC DEVICE

(75) Inventors: Mu-Seob Shin, Chungcheongnam-do (KR); Byung-Seo Kim, Gyeonggi-do (KR); Min-Young Son, Chungcheongnam-do (KR); Min-Keun Kwak, Chungcheongnam-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 184 days.

(21) Appl. No.: 12/124,915

(22) Filed: May 21, 2008

(65) Prior Publication Data
US 2008/0291652 A1    Nov. 27, 2008

(30) Foreign Application Priority Data
May 23, 2007    (KR)    ................ 10-2007-0050459

(51) Int. Cl.
*H01L 23/28* (2006.01)
(52) U.S. Cl. ............ 174/524; 174/521; 257/686; 257/730; 257/790
(58) Field of Classification Search ............ 174/521, 174/524; 257/730, 790, 686
See application file for complete search history.

(56) References Cited

U.S. PATENT DOCUMENTS

| | | | | |
|---|---|---|---|---|
| 5,151,559 A | * | 9/1992 | Conru et al. ............ | 174/529 |
| 5,585,600 A | * | 12/1996 | Froebel et al. ............ | 174/538 |
| 6,072,122 A | * | 6/2000 | Hosoya .................. | 174/524 |
| 6,180,881 B1 | * | 1/2001 | Isaak ..................... | 174/524 |
| 6,392,294 B1 | * | 5/2002 | Yamaguchi ............. | 257/690 |
| 6,738,263 B2 | * | 5/2004 | Corisis et al. ........... | 361/784 |
| 6,903,464 B2 | * | 6/2005 | Corisis ................... | 257/784 |
| 6,951,777 B2 | * | 10/2005 | Fee et al. ................ | 438/125 |
| 7,262,074 B2 | * | 8/2007 | Hall et al. ............... | 438/106 |
| 7,633,157 B2 | * | 12/2009 | Jiang et al. .............. | 257/724 |
| 2007/0018299 A1 | * | 1/2007 | Koo et al. ............... | 257/686 |
| 2009/0127687 A1 | * | 5/2009 | Fan ........................ | 257/686 |
| 2009/0127689 A1 | * | 5/2009 | Ye et al. ................. | 257/686 |

FOREIGN PATENT DOCUMENTS

| | | |
|---|---|---|
| JP | 2003-234436 | 8/2003 |
| KR | 2005-0104206 | 11/2005 |
| KR | 2005-0108198 | 11/2005 |

\* cited by examiner

*Primary Examiner*—Hung V Ngo
(74) *Attorney, Agent, or Firm*—Myers Bigel Sibley & Sajovec, PA (57) ABSTRACT

Provided are a semiconductor package and a method for forming the same, and a PCB (printed circuit board). The semiconductor package comprises: a PCB including a slit at a substantially central portion thereof, the PCB including an upper surface and a lower surface; a semiconductor chip mounted on the upper surface of the PCB; an upper molding layer disposed on the upper surface and covering the semiconductor chip; and a lower molding layer filling the slit and covering a portion of the lower surface of the PCB, wherein the PCB comprises a connecting recess at a side surface thereof, and the upper molding layer and the lower molding layer are in contact with each other at the connecting recess.

17 Claims, 14 Drawing Sheets

SEMICONDUCTOR PACKAGE, PRINTED CIRCUIT BOARD, AND ELECTRONIC DEVICE

CROSS-REFERENCE TO RELATED APPLICATIONS

This U.S. non-provisional patent application claims priority under 35 U.S.C. §119 to Korean Patent Application No. 10-2007-0050459, filed on May 23, 2007, the entire contents of which are hereby incorporated by reference.

BACKGROUND

1. Technical Field

The present invention disclosed herein relates to a semiconductor device and a method of forming the same, and more particularly, to a semiconductor package and a method of forming the same.

2. Description of the Related Art

Packaging technologies of integrated circuits in the semiconductor industry are continuously being developed to satisfy demand for miniaturization and improved mounting reliability. A packaging technology that has recently been developed is the ball grid array (BGA) package. A BGA package uses a printed circuit board (PCB) instead of a typical lead frame. A PCB includes solder balls on the entire surface opposite the surface on which a semiconductor chip is bonded, such that the BGA package can be advantageous in terms of mounting density. Also, a BGA package is electrically connected to an external circuit through the solder balls, thereby minimizing electrical signal transmission paths.

A molding layer of a BGA package may include an epoxy molding compound (EMC). During the forming of a molding layer, sweeping of wires can occur. Also, the molding layer may include an upper molding layer covering the semiconductor chip and a lower molding layer covering the wires. Because the contacting area between the upper molding layer and the lower molding layer is small, the BGA package can be easily delaminated.

SUMMARY

The present invention provides a semiconductor package and a method of forming the same that minimize sweeping of wires and delamination of a molding layer. The present invention also provides a printed circuit board that minimizes sweeping of wires. The present invention further provides a stacked semiconductor package that minimizes delamination of a molding layer.

According to some embodiments of the present invention, semiconductor packages include: a PCB including a slit at a substantially central portion thereof; a semiconductor chip mounted on the PCB; an upper molding layer covering the semiconductor chip; and a lower molding layer filling the slit and covering a portion of an undersurface of the PCB, wherein the PCB includes a connecting recess at a side surface thereof, and the upper molding layer and the lower molding layer are in contact at the connecting recess.

BRIEF DESCRIPTION OF THE DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION

Preferred embodiments of a semiconductor package and a method of forming the same, a printed circuit board, and an electronic device according to the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the specification, the dimensions of layers and regions are exaggerated for clarity of illustration. It will also be understood that when a layer (or film) is referred to as being 'on' another layer or substrate, it can be directly on the other layer or substrate, or intervening layers may also be present. Whenever possible, like reference numerals are used for referring to the same or similar elements in the description and drawings.

Figure 1:
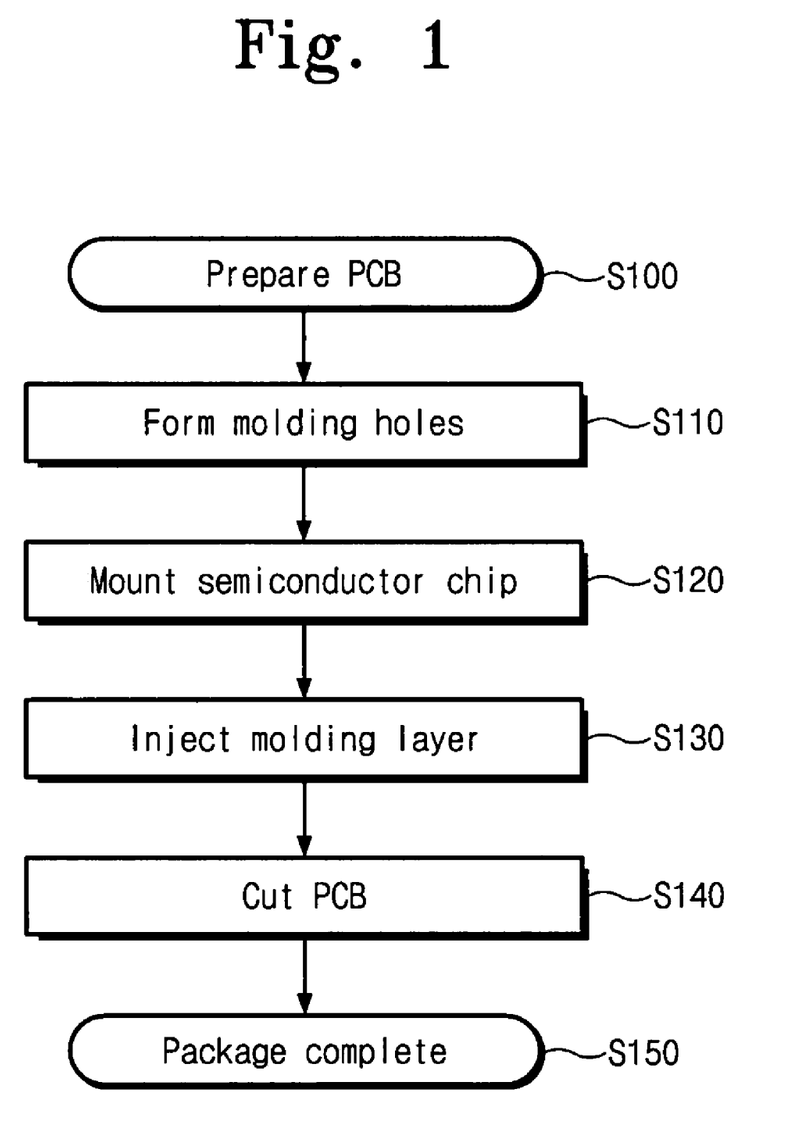
FIG. 1 is a flowchart of a method for forming a semiconductor package according to embodiments of the present invention.

FIG. 1 is a flowchart of a method for forming a semiconductor package according to embodiments of the present invention.

Referring to FIG. 1, the method of forming a semiconductor package includes preparing a PCB in operation S100, forming molding holes in operation S110, mounting a semiconductor chip in operation S120, injecting a molding layer in operation S130, and cutting the PCB in operation S140.

Figure 2:
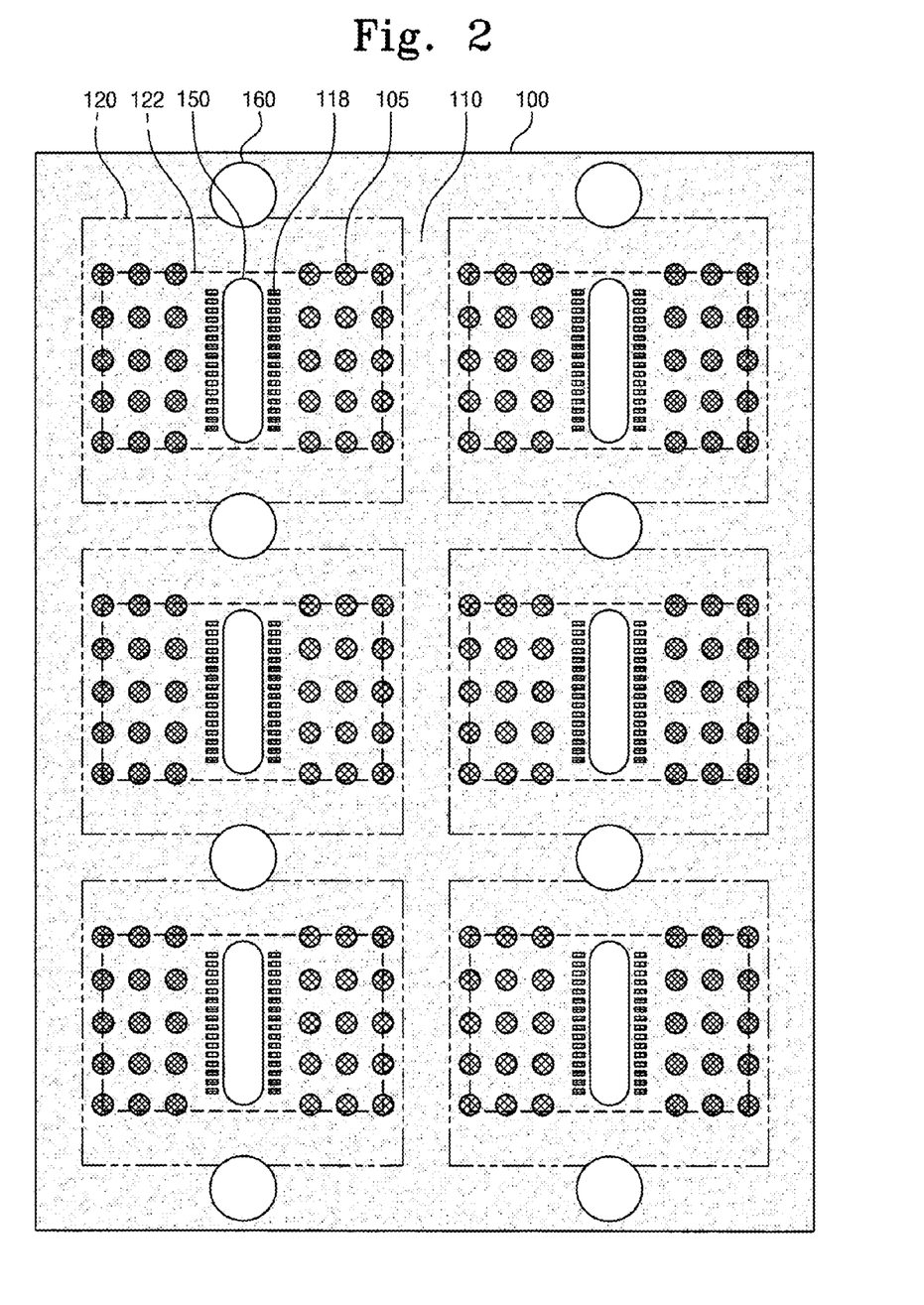
FIGS. 2 and 3 are diagrams illustrating a method of forming a semiconductor package according to an embodiment of the present invention.

Referring to FIG. 2, a description will be provided regarding preparing a PCB in operation S100 and forming molding holes in operation S110, according to an embodiment of the present invention.

A PCB 100, including chip regions 120 with mounting regions 122 and a scribe region 110, is prepared. The mounting region 122 is a region on which a semiconductor chip is mounted. A slit 150 is formed in the substantially central portion of the mounting region 122. A molding hole 160 is formed on the scribe region 110 and partially extending into the chip region 120. The molding hole 160 may be configured in various shapes including a circle, oval, triangle, and rectangle. The molding hole 160 may be formed so as to be disposed along the longitudinal direction of the slit 150. The molding hole 160 may be formed with a width greater than that of the slit 150. The slit 150 may be formed to have a sufficiently large width to allow a molding layer described below to be easily formed on front and rear surfaces of the PCB 100. The PCB 100 may include bond fingers 118 and bond lands 105 formed on the chip region 120.

Figure 3:
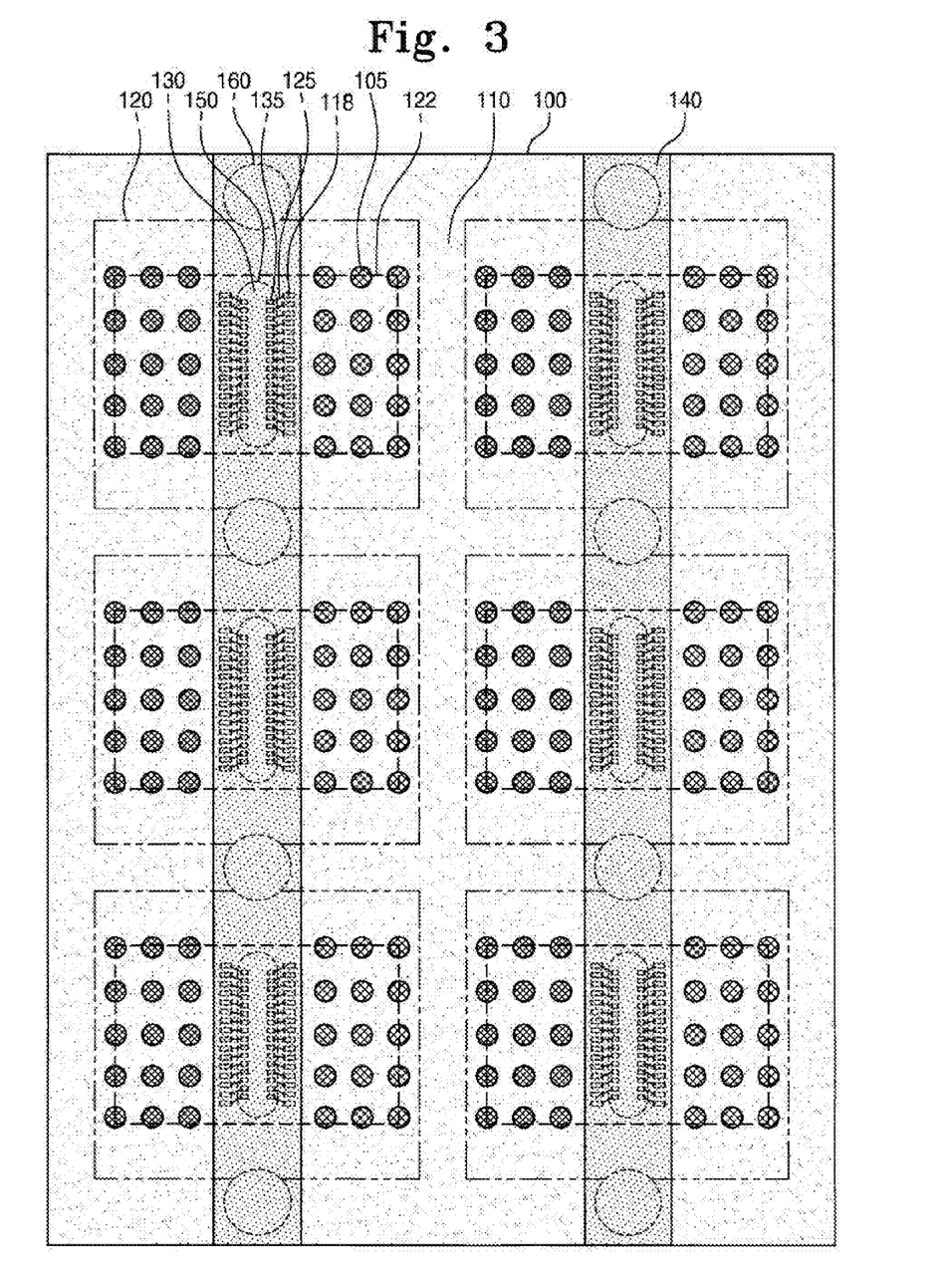

Referring to FIG. 3, the mounting of a semiconductor chip in operation S120 and the injecting of the molding layer in operation S130 will be described according to an embodiment of the present invention.

A semiconductor chip 130 is mounted on the mounting region 122. The semiconductor chip 130 is mounted on the rear surface of the PCB 100 so as to cover the slit 150. The semiconductor chip 130 includes bonding pads 135 at the substantially central portion thereof, and the bonding pads 135 may be exposed by the slit 150. Wires 125 are formed to electrically connect the bonding pads 135 to the bond fingers 118.

A molding layer 140 is injected in the molding holes 160. The molding layer 140 may be formed of an epoxy molding compound (EMC). The widths of the molding holes 160 may be made sufficiently large to prevent sweeping of the wires 118. Also, the slits 150 may be completely covered by the semiconductor chips 130 on the rear surface of the PCB 100, such that the molding layer 140 is not injected through the slits 150 from the rear surface of the PCB 100. Thus, sweeping of the wires 118 can be prevented.

The molding layer 140 includes an upper molding layer covering the semiconductor chips 130 on the rear surface of the PCB 100 and a lower molding layer filling the slits 150 and covering the bond fingers 118 on the front surface of the PCB 100. The upper molding layer and the lower molding layer may contact at the molding holes 160. Thus, delamination of the molding layer 140 can be prevented. The lower molding layer may be formed with a greater width than that of the molding holes 160.

After the molding layer 140 is formed, operation S140 of cutting the PCB is performed. The PCB 100 is cut along the scribe region 110. The cutting of the PCB 100 may include leaving portions of the molding layer 140 in the molding holes 160 in the chip region 120. In other words, the cutting operation might not completely remove the molding holes 160, such that a portion of the molding layer 140, connecting the upper and lower molding layers, remains after the cutting operation.

Figure 4:
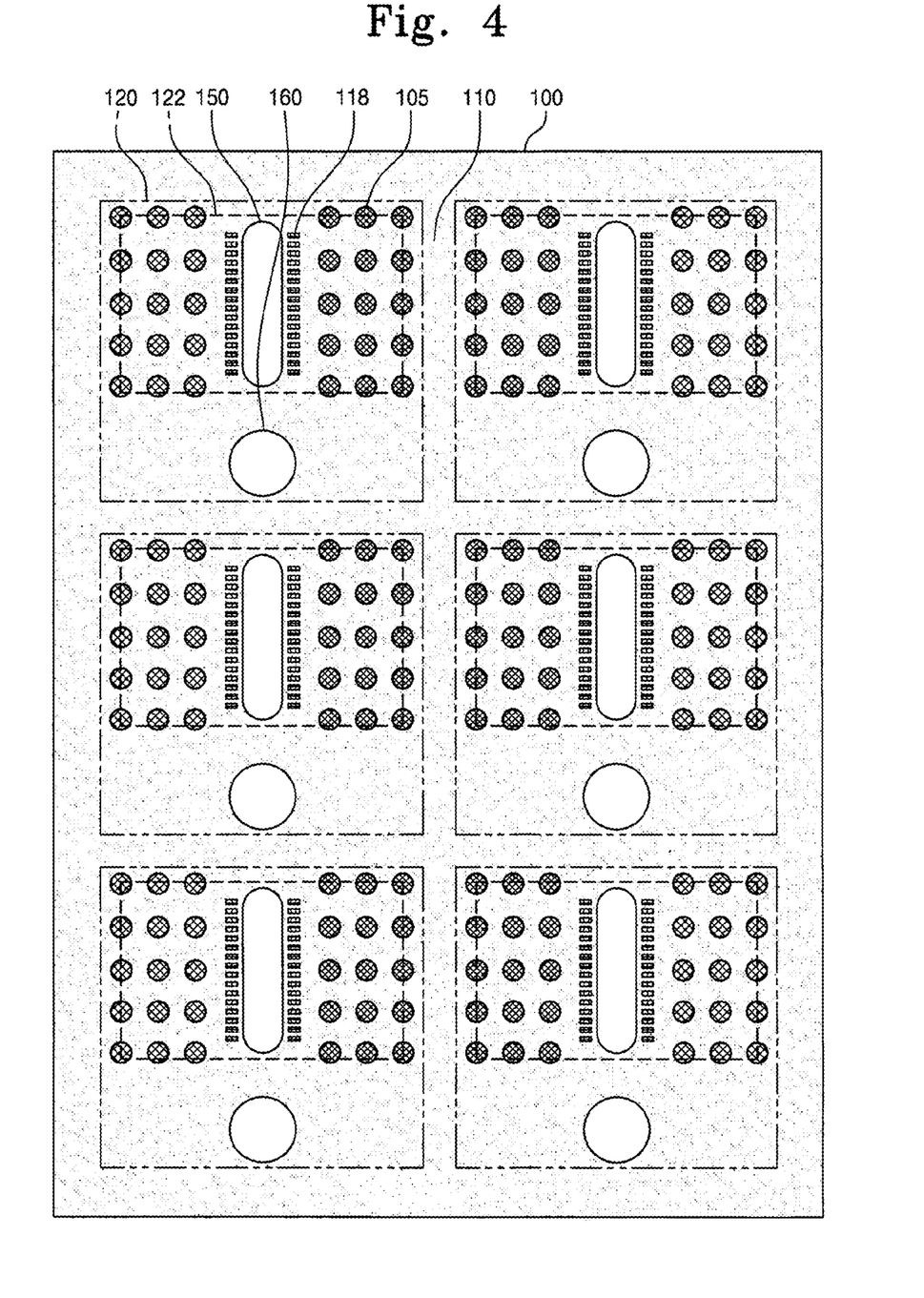
FIG. 4 is a diagram illustrating a method of forming a semiconductor package according to another embodiment of the present invention.

Referring to FIG. 4, preparing a PCB in operation S100 and forming molding holes in operation S110 according to another embodiment of the present invention will be described.

A PCB 100, including a chip region 120, with a mounting region 122, and a scribe region 110, is prepared. The mounting region 122 is a region on which a semiconductor chip is mounted. A slit 150 is formed in a substantially central portion of the mounting region 122. A molding hole 160 is formed between the mounting region 122 and the scribe region 110. The molding hole 160 is formed in the chip region 120 such that the center of the mounting region 122 is offset from the center of the chip region 120. That is, the mounting region 122 may be formed to be offset to one side of the chip region 120.

The molding hole 160 may be one of various shapes such as a circle, oval, triangle, and rectangle. The molding hole 160 may be formed to be disposed along a longitudinal direction of the slit 150. The molding hole 160 may be formed with a width greater than that of the slit 150. By forming the slit 150 to have a sufficiently large width, the molding layer described below can easily be supplied to both front and rear surfaces of the PCB 100. The PCB 100 may include bond fingers 118 and ball lands 105 formed on the chip region 120.

Figure 5:
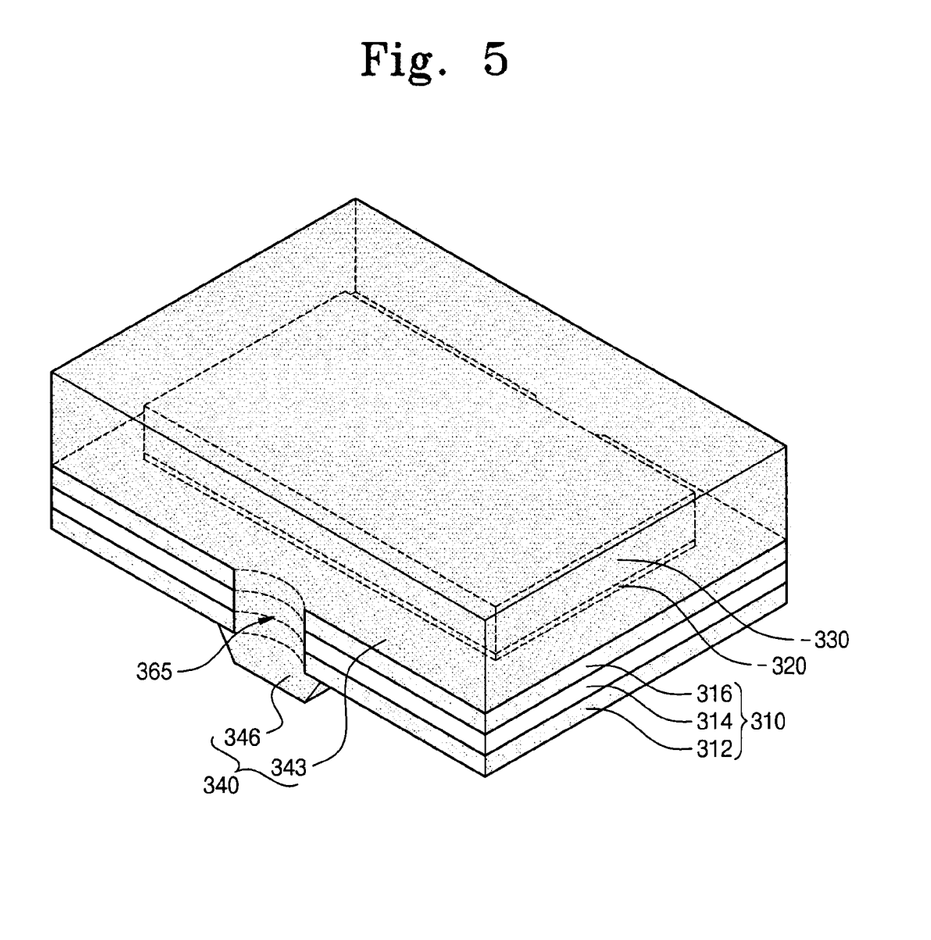
FIGS. 5 and 6 are diagrams illustrating a semiconductor package according to an embodiment of the present invention.
Figure 6:
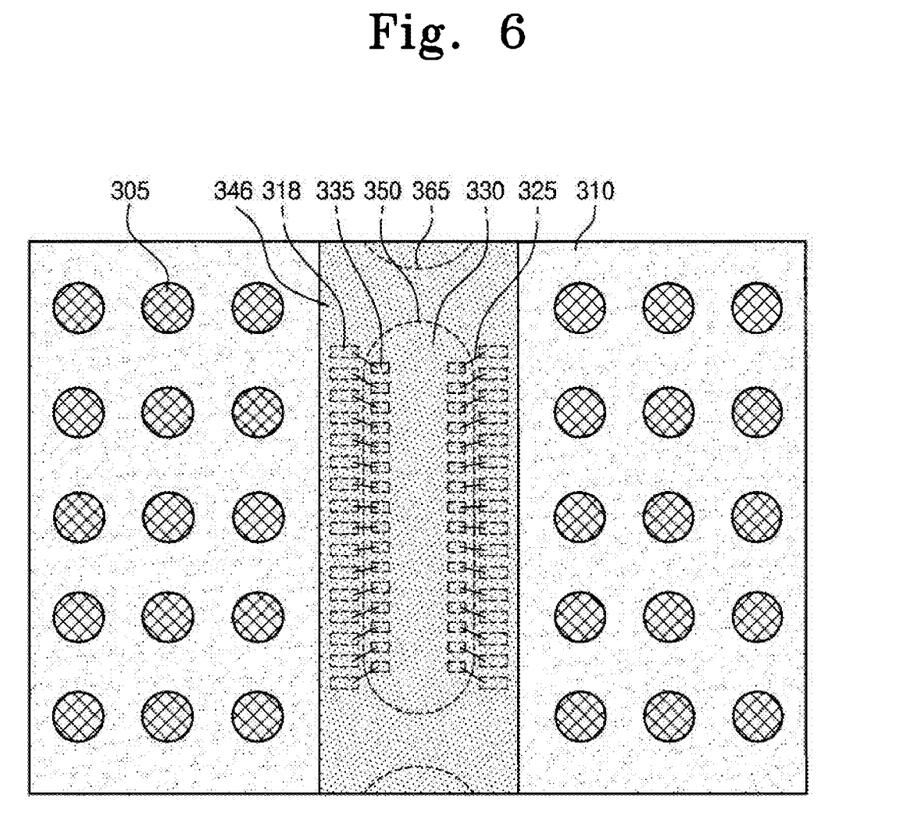

FIGS. 5 and 6 are diagrams illustrating a semiconductor package according to an embodiment of the present invention. FIG. 6 is an undersurface plan view of the semiconductor package in FIG. 5.

Referring to FIGS. 5 and 6, a PCB 310 including a slit 350 at a substantially central portion thereof is provided. The PCB 310 may include a lower dielectric 312, a core material layer 314, and an upper dielectric 316. The lower dielectric 312 and the upper dielectric 316 may include a photo solder resist (PSR). Ball lands 305 are disposed on the lower dielectric 312. Solder balls (not shown) may be attached to the ball lands 305. The PCB 310 may include bond fingers 318 disposed around the slit 350.

A semiconductor chip 330 is disposed on the PCB 310. The semiconductor chip 330 may be attached to the PCB 310 by a bonding layer 320. The semiconductor chip 330 may include bonding pads 335 disposed in the substantially central portion thereof. The bonding pads 335 may be exposed by the slit 350. The semiconductor chip 330 may be mounted so as to cover the slit 350. Wires 325 may be provided for electrically connecting the bonding pads 335 and the bond fingers 318.

An upper molding layer 343 is provided to cover the semiconductor chip 330. A lower molding layer 346 is provided to fill the slit 350 and cover a portion of the undersurface of the PCB 310. The upper molding layer 343 and the lower molding layer 346 may include an epoxy molding compound (EMC). The side surface of the PCB 310 may include a connecting recess 365, and the upper molding layer 343 and the lower molding layer 346 may come into contact at the connecting recess 365. As a result, delamination of the upper molding layer 343 and the lower molding layer 346 can be prevented. The connecting recess 365 may be disposed along a longitudinal direction of the slit 350. The connecting recess 365 may be provided at either or both of the longitudinal ends of the slit 350. The connecting recess 365 may be formed narrower than the width of the lower molding layer 346.

According to an embodiment of the present invention, the molding hole 160 may be formed to have an ample width and may be spaced apart from the wires 118, such that sweeping of the wires 118 can be prevented. Also, delamination of the molding layer 140 can be prevented by the connecting recess 365.

Figure 7:
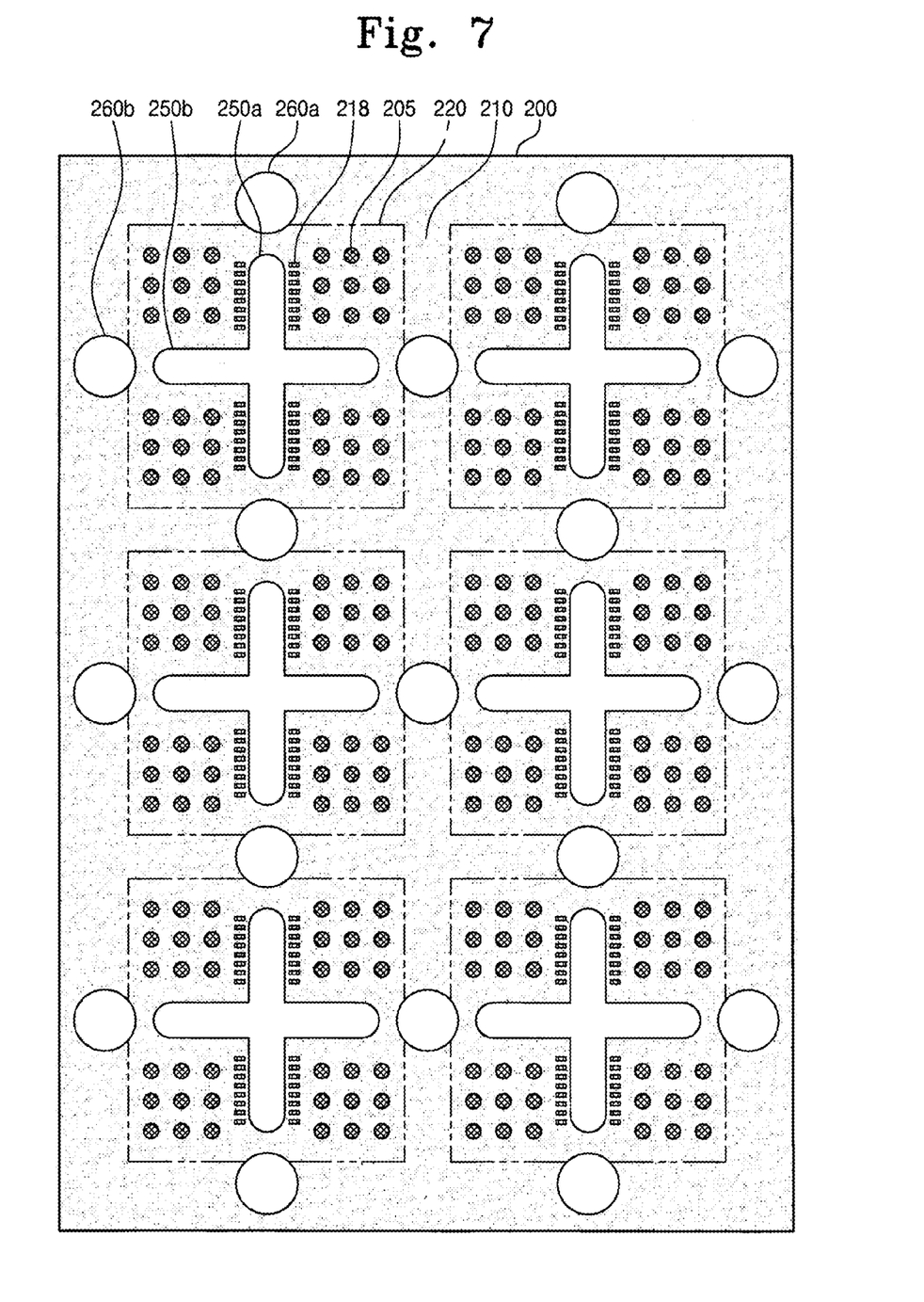
FIG. 7 is a diagram illustrating a method of forming a semiconductor package according to another embodiment of the present invention.

Referring to FIG. 7, a description will be provided of operation S100 for preparing a PCB and operation S110 for forming a molding hole, according to another embodiment of the present invention.

A PCB 200, including chip regions 220 and a scribe region 210, is prepared. A first slit 250a is formed in a substantially central portion of the chip region 220 and extending in a first direction. First molding holes 260a are formed in the scribe region 210 so as to extend into the chip regions 220. The first molding holes 260a may be formed in various shapes such as a circle, oval, triangle, and rectangle. The first molding holes 260a may be formed in positions along longitudinal directions of the first slits 250a (i.e. along the first direction).

Second slits 250b are formed in the chip regions 220 so as to intersect the first slits 250a and extending in a second direction. Second molding holes 260b are formed in the scribe region 210 so as to extend into the chip regions 220. The second molding holes 260b may be formed at positions along a longitudinal direction of the second slits 250b (i.e. along the second direction). The first and second molding holes 260a and 260b may be formed with widths wider than the first and second slits 250a and 250b. The first and second slits 250a and 250 may be formed to have sufficient widths, such that a molding layer described below can easily be supplied to both front and rear surfaces of the PCB 200. The PCB 200 may include bond fingers 218 and ball lands 205 formed in the chip regions 220. Next, operation S120 for mounting the semiconductor chip, operation S130 for injecting a molding layer, and operation S140 for cutting the PCB may be performed.

Figure 8:
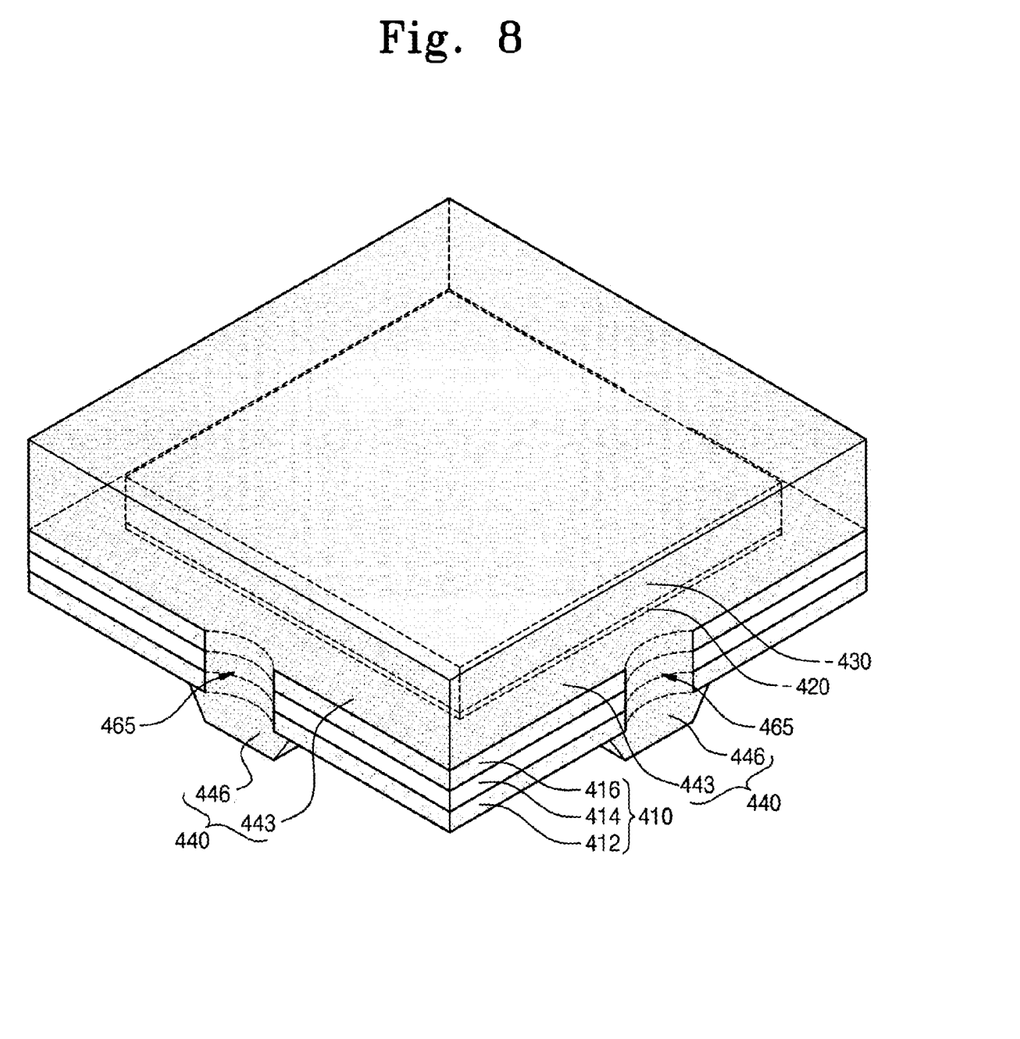
FIGS. 8 and 9 are diagrams illustrating a semiconductor package according to another embodiment of the present invention.
Figure 9:
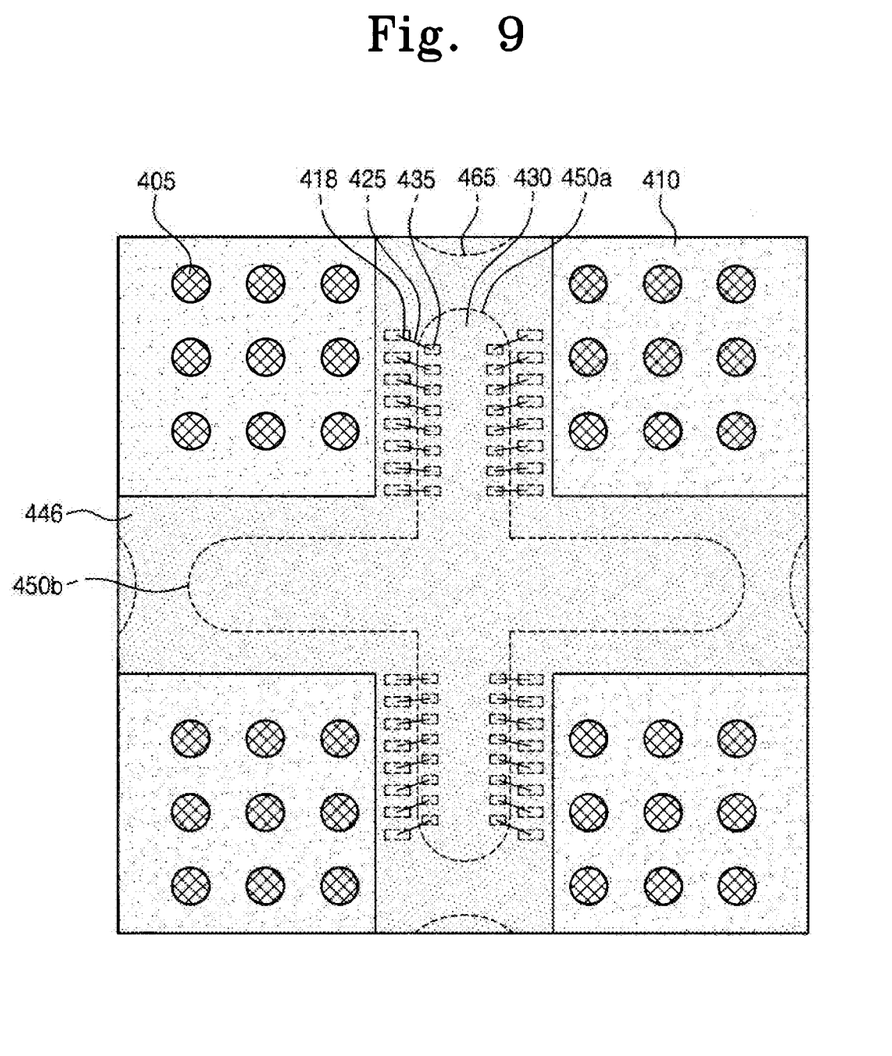

FIGS. 8 and 9 are diagrams illustrating a semiconductor package according to another embodiment of the present invention. FIG. 9 is a plan view of the undersurface of the semiconductor package in FIG. 8.

Referring to FIGS. 8 and 9, a PCB 410, including a first slit 450a and a second slit 450b intersecting the first slit 450a, is provided. The PCB 410 may include a lower dielectric 412, a core material layer 414, and an upper dielectric 416. The lower dielectric 412 and the upper dielectric 416 may include a photo solder resist (PSR). Ball lands 405 may be disposed on the lower dielectric 412. Solder balls (not shown) may be attached to the ball lands 405. The PCB 410 may include bond fingers 418 disposed around the first slit 450a.

A semiconductor chip 430 is disposed on the PCB 410. The semiconductor chip 430 may be attached to the PCB 410 by means of a bonding layer 420. The semiconductor chip 430 may include bonding pads 435 at a substantially central portion. The bonding pads 435 may be exposed by the first slit 450a. The semiconductor chip 430 may be mounted to cover the first and second slits 450a and 450b. Wires 425 may be provided to electrically connect the bonding pads 435 to the bond fingers 418.

An upper molding layer 443 is provided to cover the semiconductor chip 430. A lower molding layer 446 is provided to fill the first and second slits 450a and 450b and cover a portion of the undersurface of the PCB 410. The upper molding layer 443 and the lower molding layer 446 may include an epoxy molding compound (EMC). The side surface of the PCB 410 may include at least one connecting recess 465, and the upper molding layer 443 and the lower molding layer 446 may be in contact at the connecting recess 465. Accordingly, delamination of the upper molding layer 443 and the lower molding layer 446 can be prevented. The connecting recess 465 may be provided at either or both ends along longitudinal directions of the first and second slits 450a and 450b, respectively.

Figure 10:
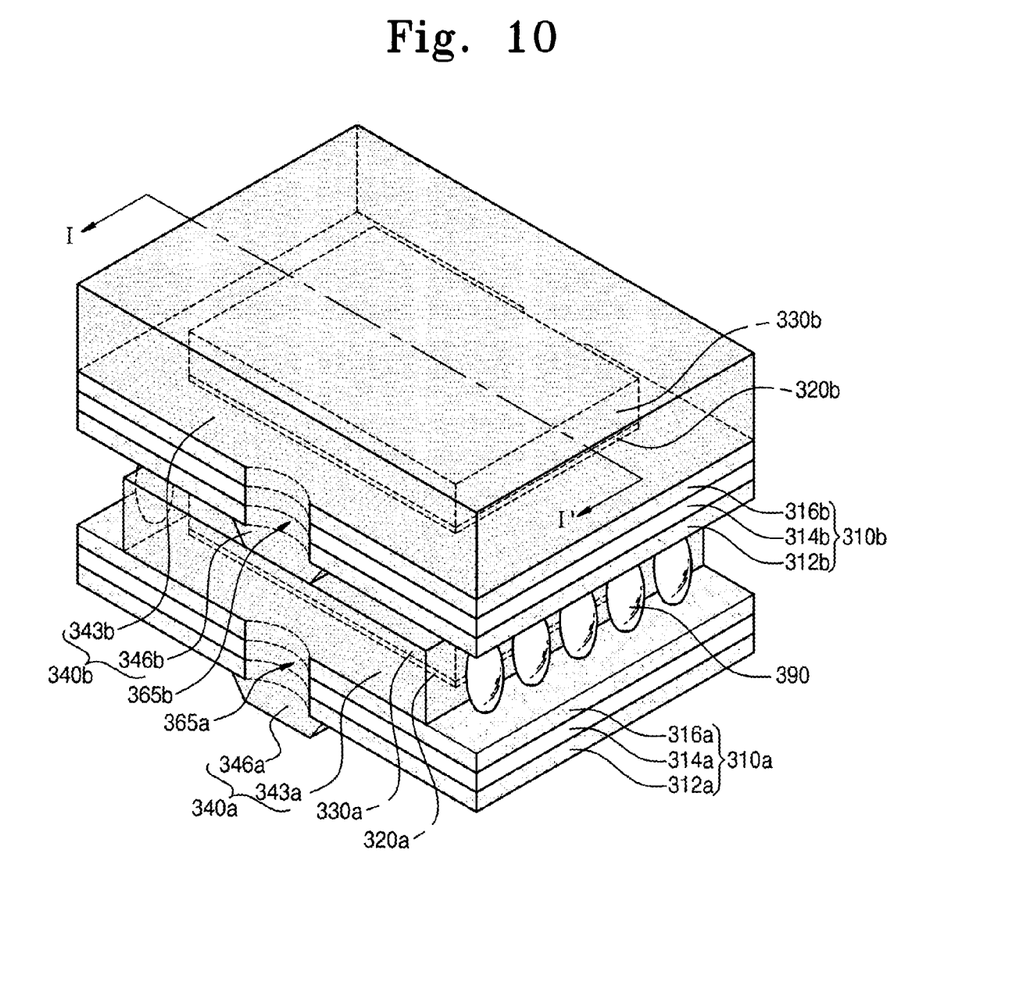
FIGS. 10 through 12 are diagrams illustrating semiconductor packages according to other embodiments of the present invention.
Figure 11:
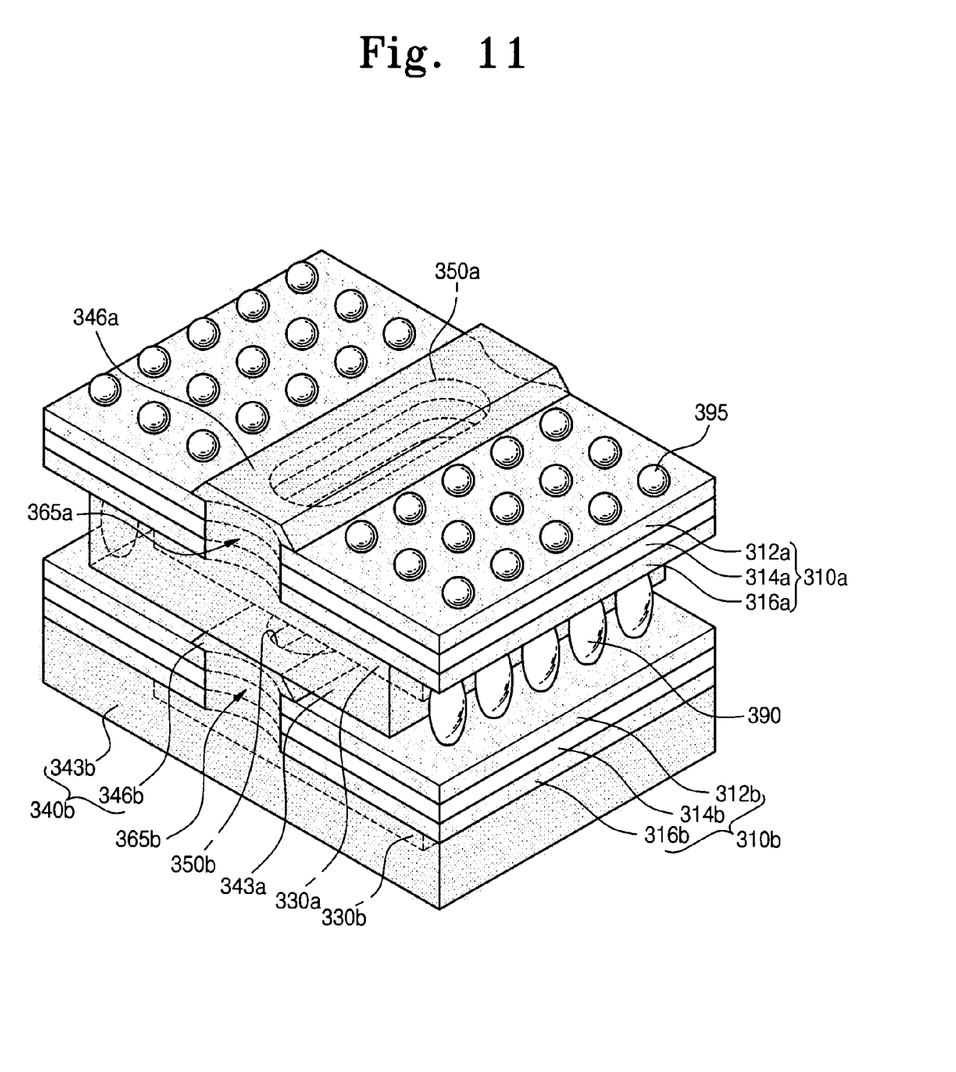
Figure 12:
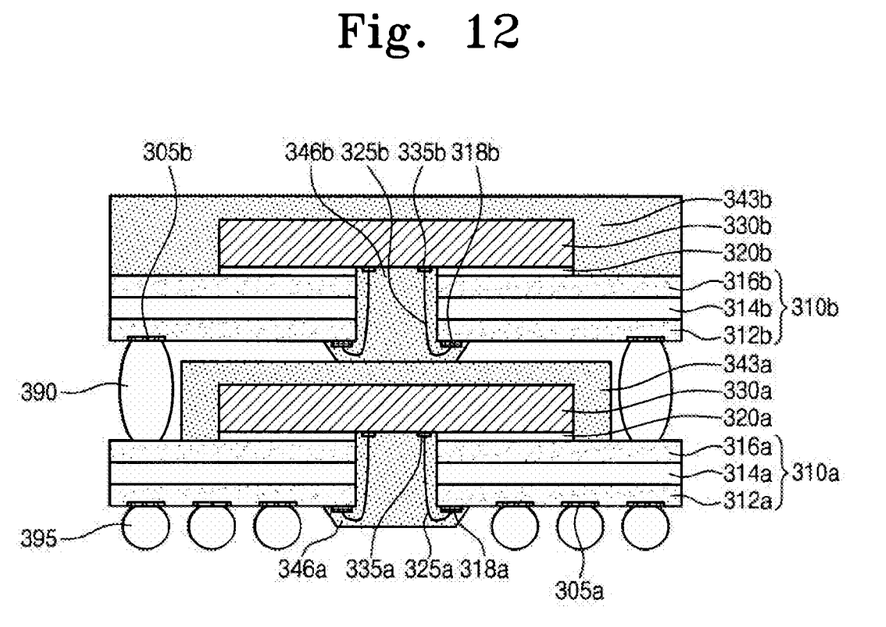

FIGS. 10 through 12 are diagrams illustrating semiconductor packages according to other embodiments of the present invention. FIG. 11 is a frontal perspective view of FIG. 10. FIG. 12 is a sectional view taken along line I-I' in FIG. 10.

Referring to FIGS. 10 through 12, a first PCB 310a including a first slit 350a at a substantially central portion thereof is provided. The first PCB 310a may include a first lower dielectric 312a, a first core material layer 314a, and a first upper dielectric 316a. The first lower dielectric 312a and the first upper dielectric 316a may include a photo solder resist (PSR). Solder balls 395 are attached to first ball lands 305a disposed on the first lower dielectric 312a. The first PCB 310a may include first bond fingers 318a disposed around the first slit 350a.

A first semiconductor chip 330a may be mounted on the first PCB 310a. The first semiconductor chip 330a may be attached to the first PCB 310a by a first bonding layer 320a. The first semiconductor chip 330a may include first bonding pads 335a disposed at its central portion. The first bonding pads 335a may be exposed by the first slit 350a. The first semiconductor chip 330a may be mounted so as to completely cover the first slit 350a. First wires 325a may be provided to electrically connect the first bonding pads 335a and the first bond fingers 318a.

A first upper molding layer 343a is provided to cover the first semiconductor chip 330a. A first lower molding layer 346a is provided to fill the first slit 350a and cover a portion of the undersurface of the first PCB 310a. The first upper molding layer 343a and the first lower molding layer 346a may include an epoxy molding compound (EMC). A first connecting recess 365a may be included at a side surface of the first PCB 310a, and the first upper molding layer 343a and the first lower molding layer 346a may be contacted at the first connecting recess 365a. The first connecting recess 365a may be disposed along a longitudinal direction of the first slit 350a. The first connecting recess 365a may be formed with a width narrower than the width of the first lower molding layer 346a. The first connecting recess 365a may be provided along a longitudinal direction of the first slit 350a at either or both ends thereof.

A second PCB 310b is disposed on the first upper molding layer 343a. The second PCB 310b may include a second lower dielectric 312b, a second core material layer 314b, and a second upper dielectric 316b. The second PCB 310b may be electrically connected to the first PCB 310a through second solder balls 390. The second solder balls 390 may be attached to second ball lands 305b disposed on the second lower dielectric 312b. The second PCB 310b may have a second slit 350b at a substantially central portion thereof. A second semiconductor chip 330b is mounted on the second PCB 310b so as to completely cover the second slit 350b. The second semiconductor chip 330b is mounted on the second PCB 310b using a second bonding layer 320b. The second semiconductor chip 330b may include second bonding pads 335b, and the second bonding pads 335b may be electrically connected to bond fingers 318b of the second PCB 310b through second wires 325b.

A second upper molding layer 343b is provided to cover the second semiconductor chip 330b. A second lower molding layer 346b is provided to fill the second slit 350b and cover a portion of the undersurface of the second PCB 310b. Side surfaces of the second PCB 310b may include second connecting recesses 365b, and the second upper molding layer 343b and the second lower molding layer 346b may be in contact at the second connecting recesses 365b. The second connecting recesses 365b may be disposed along a longitudinal direction of the second slit 350b. The second connecting recesses 365b may have a width narrower than that of the second lower molding layer 346b. The second connecting recesses may be provided at either or both ends and along a longitudinal direction of the second slit 350b.

Figure 13:
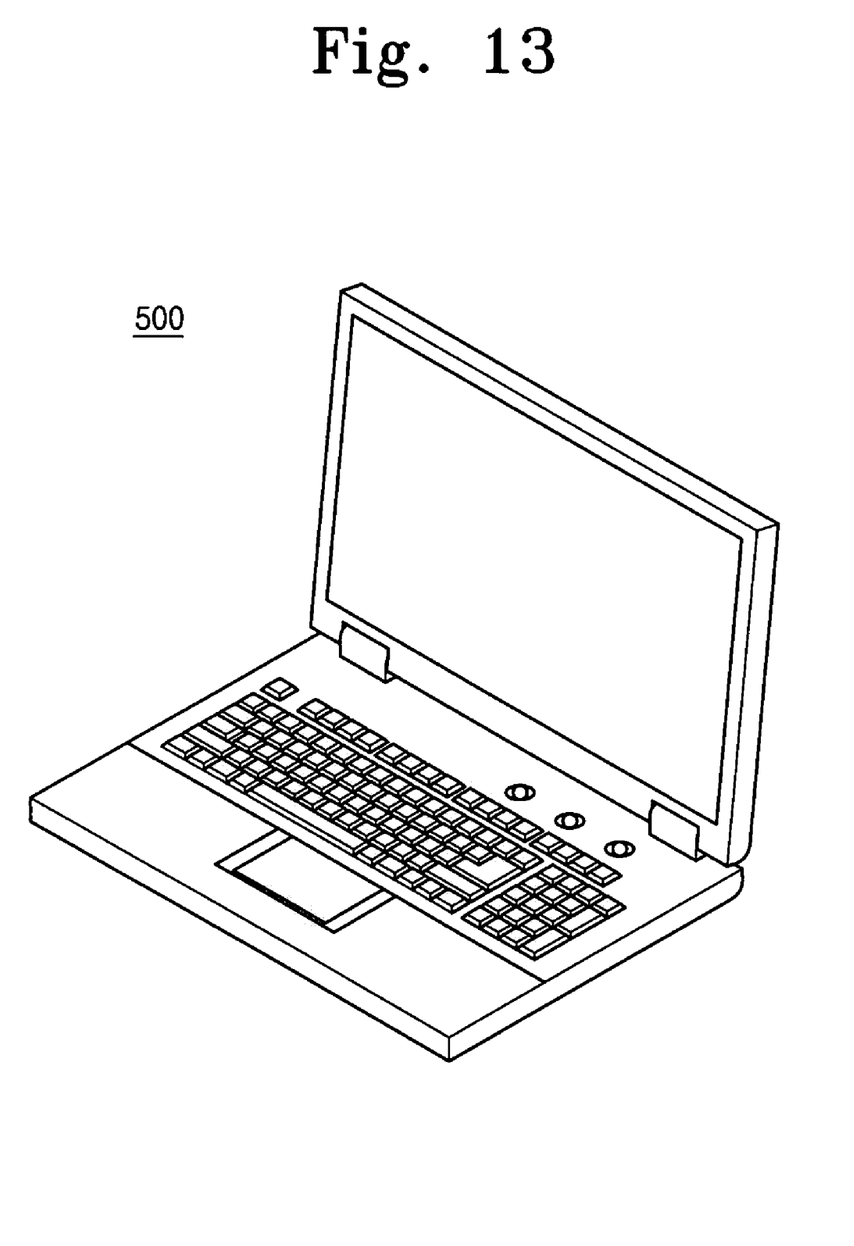
FIGS. 13 and 14 are diagrams illustrating electronic devices including semiconductor packages according to embodiments of the present invention.
Figure 14:
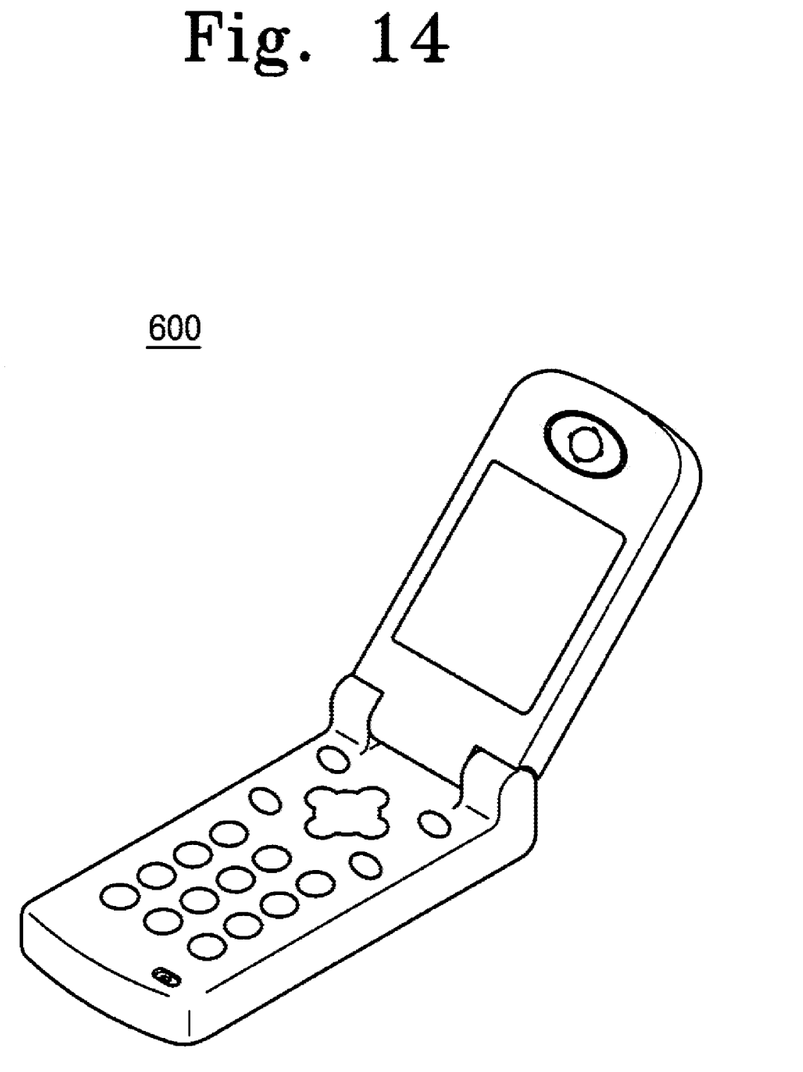

Referring to FIGS. 13 and 14, electronic devices including semiconductor packages according to embodiments of the present invention will be described. Such an electronic device includes a semiconductor package having the connecting recess. The electronic device may be a laptop computer 500 or a mobile phone 600. The electronic device may also be one of other electronic devices including camcorders, game consoles, etc.

According to embodiments of the present invention, a molding hole extending to a chip region of a PCB is provided. The molding hole is formed with a sufficient width such that a molding layer can be easily supplied to both front and rear surfaces of the PCB. Sweeping of wires can be prevented because the molding hole is separated from a slit.

According to embodiments of the present invention, the side surface of a PCB includes a connecting recess. An upper molding layer and a lower molding layer can be in contact at the connecting recess. Accordingly, delamination of the molding layer can be prevented.

Embodiments of the present invention provide methods for forming a semiconductor package, the methods including: preparing a PCB (printed circuit board) including a chip region having a mounting region on which a semiconductor chip is to be mounted, and a scribe region; forming a molding hole in the chip region between the mounting region and the scribe region; mounting a semiconductor chip on the mounting region of the PCB; injecting a molding layer in the molding hole; and cutting the PCB along the scribe region.

The molding hole may be formed to extend from the chip region to the scribe region.

The semiconductor chip may include bonding pads at a substantially central portion thereof, and the PCB may include a slit exposing the bonding pads.

The molding hole may be formed to be disposed along a longitudinal direction of the slit. The molding hole may be formed to have a width greater than a width of the slit. The semiconductor chip may be mounted to cover the slit.

The molding layer may include an upper molding layer covering the semiconductor chip, and a lower molding layer filling the slit and covering a portion of an undersurface of the PCB, and the upper molding layer and the lower molding layer may be in contact at the molding hole.

The lower molding layer may be formed to have a width greater than a width of the molding hole.

The semiconductor chip may include bonding pads at a substantially central portion thereof, and the PCB may include a first slit exposing the bonding pads, and a second slit intersecting the first slit.

The molding hole may be formed to be disposed along a longitudinal direction of the first slit.

The method may further include a second molding hole formed to be disposed along a longitudinal direction of the second slit.

The PCB may include bond fingers around the slit, and the method may further include forming wires electrically connecting the bond fingers and the bonding pads.

The cutting of the PCB may include leaving behind a portion of the shape of the molding hole at an edge of the chip region.

The mounting region may be formed offset to one side of the chip region.

In other embodiments of the present invention, semiconductor packages include: a PCB including a slit in a substantially central portion thereof; a semiconductor chip mounted on the PCB; an upper molding layer covering the semiconductor chip; and a lower molding layer filling the slit and covering a portion of an undersurface of the PCB, wherein the PCB includes a connecting recess at a side surface thereof, and the upper molding layer and the lower molding layer contact at the connecting recess.

The connecting recess may be disposed along a longitudinal direction of the slit. The connecting recess may be provided at both ends of the slit along the longitudinal direction of the slit. The semiconductor chip may be mounted to cover the slit.

The semiconductor chip may include bonding pads disposed at a substantially central portion thereof, and the slit may include a first slit exposing the bonding pads. The slit may further include a second slit intersecting the first slit.

The connecting recess may be further provided along a longitudinal direction of the second slit at either or both ends of the second slit. The connecting recess may have a width less than a width of the lower molding layer.

In still other embodiments of the present invention, semiconductor packages include: a first PCB including a first slit at a substantially central portion thereof; a first semiconductor chip mounted on the first PCB; a first upper molding layer covering the first semiconductor chip; a first lower molding layer filling the first slit and covering a portion of an undersurface of the first PCB; a second PCB disposed above or below the first semiconductor chip; and a second semiconductor chip mounted on the second PCB, wherein the first PCB further includes a first connecting recess at a side surface thereof, and the first upper molding layer and the first lower molding layer contact at the first connecting recess. The first connecting recess may be disposed along a longitudinal direction of the first slit.

The second PCB may include a second slit, and the semiconductor package may further include a second upper molding layer covering the second semiconductor chip, and a second lower molding layer filling the second slit and covering a portion of an undersurface of the second PCB, and the second PCB may further include a second connecting recess at a side surface thereof, and the second upper molding layer and the second lower molding layer may contact at the second connecting recess. The second connecting recess may be disposed along a longitudinal direction of the second slit.

The first semiconductor chip may be mounted to cover the first slit, and the second semiconductor chip may be mounted to cover the second slit.

The first connecting recess may be provided at either or both ends of the first slit along a longitudinal direction of the first slit, and the second connecting recess may be provided at either or both ends of the second slit along a longitudinal direction of the second slit.

The first connecting recess may have a width less than a width of the first lower molding layer, and the second connecting recess may have a width less than a width of the second lower molding layer.

The PCB includes a chip region including a mounting region having a slit, and a scribe region around the chip region, and the chip region includes a molding hole disposed between the scribe region and the slit. The molding hole extends from the chip region to the scribe region. The molding hole has a width greater than a width of the slit.

The molding hole may be disposed along a longitudinal direction of the slit. The PCB may further include bond fingers disposed around the slit, and ball lands disposed on the chip region. The mounting region may be disposed offset to one side of the chip region.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor package comprising:
   a printed circuit board (PCB) including a slit at a substantially central portion thereof, the PCB including an upper surface and a lower surface;
   a semiconductor chip mounted on the upper surface of the PCB;
   an upper molding layer disposed on the upper surface and covering the semiconductor chip; and
   a lower molding layer filling the slit and covering a portion of the lower surface of the PCB, wherein the PCB comprises a connecting recess at a side surface thereof, and the upper molding layer and the lower molding layer are in contact with each other at the connecting recess.

2. The semiconductor package of claim 1, wherein the connecting recess is disposed along a longitudinal direction of the slit.

3. The semiconductor package of claim 2, wherein the connecting recess is provided at both ends of the slit along the longitudinal direction of the slit.

4. The semiconductor package of claim 1, wherein the semiconductor chip is mounted so as to cover the slit.

5. The semiconductor package of claim 1, wherein the semiconductor chip comprises bonding pads disposed at a substantially central portion thereof, and the slit comprises a first slit exposing the bonding pads.

6. The semiconductor package of claim 5, wherein the slit further comprises a second slit intersecting the first slit.

7. The semiconductor package of claim 6, wherein the connecting recess is further provided along a longitudinal direction of the second slit at both ends of the second slit.

8. The semiconductor package of claim 1, wherein the connecting recess has a width less than a width of the lower molding layer.

9. An electronic device comprising the semiconductor package of claim 1.

10. A semiconductor package comprising:
a first PCB including a first slit at a substantially central portion thereof;
a first semiconductor chip mounted on the first PCB;
a first upper molding layer covering the first semiconductor chip;
a first lower molding layer filling the first slit and covering a portion of an undersurface of the first PCB;
a second PCB disposed on the first semiconductor chip; and
a second semiconductor chip mounted on the second PCB,
wherein the first PCB further includes a first connecting recess at a side surface thereof, and the first upper molding layer and the first lower molding layer are in contact with each other at the first connecting recess.

11. The semiconductor package of claim 10, wherein the first connecting recess is disposed along a longitudinal direction of the first slit.

12. The semiconductor package of claim 10, wherein the second PCB comprises a second slit, and the semiconductor package further comprises:
a second upper molding layer covering the second semiconductor chip; and
a second lower molding layer filling the second slit and covering a portion of an undersurface of the second PCB,
wherein the second PCB further comprises a second connecting recess at a side surface thereof, and the second upper molding layer and the second lower molding layer are in contact with each other at the second connecting recess.

13. The semiconductor package of claim 12, wherein the second connecting recess is disposed along a longitudinal direction of the second slit.

14. The semiconductor package of claim 12, wherein the first semiconductor chip is mounted so as to cover the first slit, and the second semiconductor chip is mounted so as to cover the second slit.

15. The semiconductor package of claim 12, wherein the first connecting recess is provided at both ends of the first slit along a longitudinal direction of the first slit, and the second connecting recess is provided at both ends of the second slit along a longitudinal direction of the second slit.

16. The semiconductor package of claim 12, wherein the first connecting recess has a width less than a width of the first lower molding layer and the second connecting recess has a width less than a width of the second lower molding layer.

17. An electronic device comprising the semiconductor package of claim 10.

* * * * *